United States Patent
Hirai

(10) Patent No.: US 12,388,439 B2
(45) Date of Patent: Aug. 12, 2025

(54) SEMICONDUCTOR INTEGRATED CIRCUIT AND ELECTRONIC APPARATUS

(71) Applicant: Masaru Hirai, Tokyo (JP)

(72) Inventor: Masaru Hirai, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 27 days.

(21) Appl. No.: 18/627,937

(22) Filed: Apr. 5, 2024

(65) Prior Publication Data

US 2024/0388286 A1    Nov. 21, 2024

(30) Foreign Application Priority Data

May 16, 2023 (JP) ................................. 2023-080974

(51) Int. Cl.
*G06F 1/24* (2006.01)
*H03K 17/22* (2006.01)

(52) U.S. Cl.
CPC ............ *H03K 17/223* (2013.01); *G06F 1/24* (2013.01)

(58) Field of Classification Search
CPC ......... G06F 1/24; H03K 17/22; H03K 17/223
USPC .................................................. 327/142, 143
See application file for complete search history.

(56) References Cited

U.S. PATENT DOCUMENTS

2010/0194453 A1 * 8/2010 Kadowaki ............ H03K 17/223
                                                                  327/143
2022/0271747 A1    8/2022 Takano et al.

FOREIGN PATENT DOCUMENTS

JP           2022-129021           9/2022

* cited by examiner

*Primary Examiner* — William Hernandez
(74) *Attorney, Agent, or Firm* — IPUSA, PLLC

(57) ABSTRACT

A semiconductor integrated circuit includes first and second input terminals, first and second output terminals, a first detection circuit configured to assert a first signal in response to detecting a voltage drop at the first input terminal, a second detection circuit configured to assert a second signal in response to detecting an overvoltage of the first input terminal, a third detection circuit configured to assert a third signal in response to detecting a voltage drop at the second input terminal, a first output circuit configured to monitor the first signal and the second signal, and output a first reset signal from the first output terminal in response to asserting the first signal or the second signal, and a second output circuit configured to monitor the third signal, and output a second reset signal from the second output terminal in response to asserting the third signal.

18 Claims, 6 Drawing Sheets

SEMICONDUCTOR INTEGRATED CIRCUIT AND ELECTRONIC APPARATUS

CROSS-REFERENCE TO RELATED APPLICATIONS

This application is based upon and claims priority to Japanese Patent Application No. 2023-080974, filed on May 16, 2023, the entire contents of which are incorporated herein by reference.

TECHNICAL FIELD

The present disclosure relates to semiconductor integrated circuits and electronic apparatuses.

BACKGROUND

A known reset semiconductor integrated circuit includes a voltage detection circuit, and outputs a reset signal when a power supply voltage to be monitored becomes lower than a predetermined level, as proposed in Japanese Laid-Open Patent Publication No. 2022-129021, for example.

However, according to the conventional technology, in a case where there are two or more channels of voltages to be monitored, a number of semiconductor integrated circuits that is the same as the number of voltages to be monitored, may be required. Depending on the voltage to be monitored, there are cases where outputting the reset signal is required by detecting a voltage rise, such as an overvoltage or the like, in addition to detecting a voltage drop.

SUMMARY

The present disclosure provides a semiconductor integrated circuit having both a voltage drop detection function for a plurality of channels and a voltage rise detection function for a specific channel, and an electronic apparatus including the semiconductor integrated circuit.

A semiconductor integrated circuit according to an aspect of the present disclosure includes a plurality of terminals including a first input terminal, a second input terminal, a first output terminal, and a second output terminal; a first detection circuit configured to assert a first signal in response to detecting a voltage drop at the first input terminal; a second detection circuit configured to assert a second signal in response to detecting an overvoltage of the first input terminal; a third detection circuit configured to assert a third signal in response to detecting a voltage drop at the second input terminal; a first output circuit configured to monitor the first signal and the second signal, and output a first reset signal from the first output terminal in response to asserting the first signal or the second signal; and a second output circuit configured to monitor the third signal, and output a second reset signal from the second output terminal in response to asserting the third signal.

A semiconductor integrated circuit according to another aspect of the present disclosure includes a plurality of terminals including a first input terminal, a second input terminal, a first output terminal, and a second output terminal; a first detection circuit coupled to the first input terminal; a second detection circuit coupled to the first input terminal; a third detection circuit coupled to the second input terminal; a first output circuit configured to output a first reset signal from the first output terminal when the first detection circuit detects that a voltage of the first input terminal is lower than a first threshold value or when the second detection circuit detects that the voltage of the first input terminal is higher than a second threshold value that is higher than the first threshold value; and a second output circuit configured to output a second reset signal from the second output terminal when the third detection circuit detects that a voltage of the second input terminal is lower than a third threshold value.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Hereinafter, embodiments of the present disclosure will be described with reference to the drawings.

Figure 1:
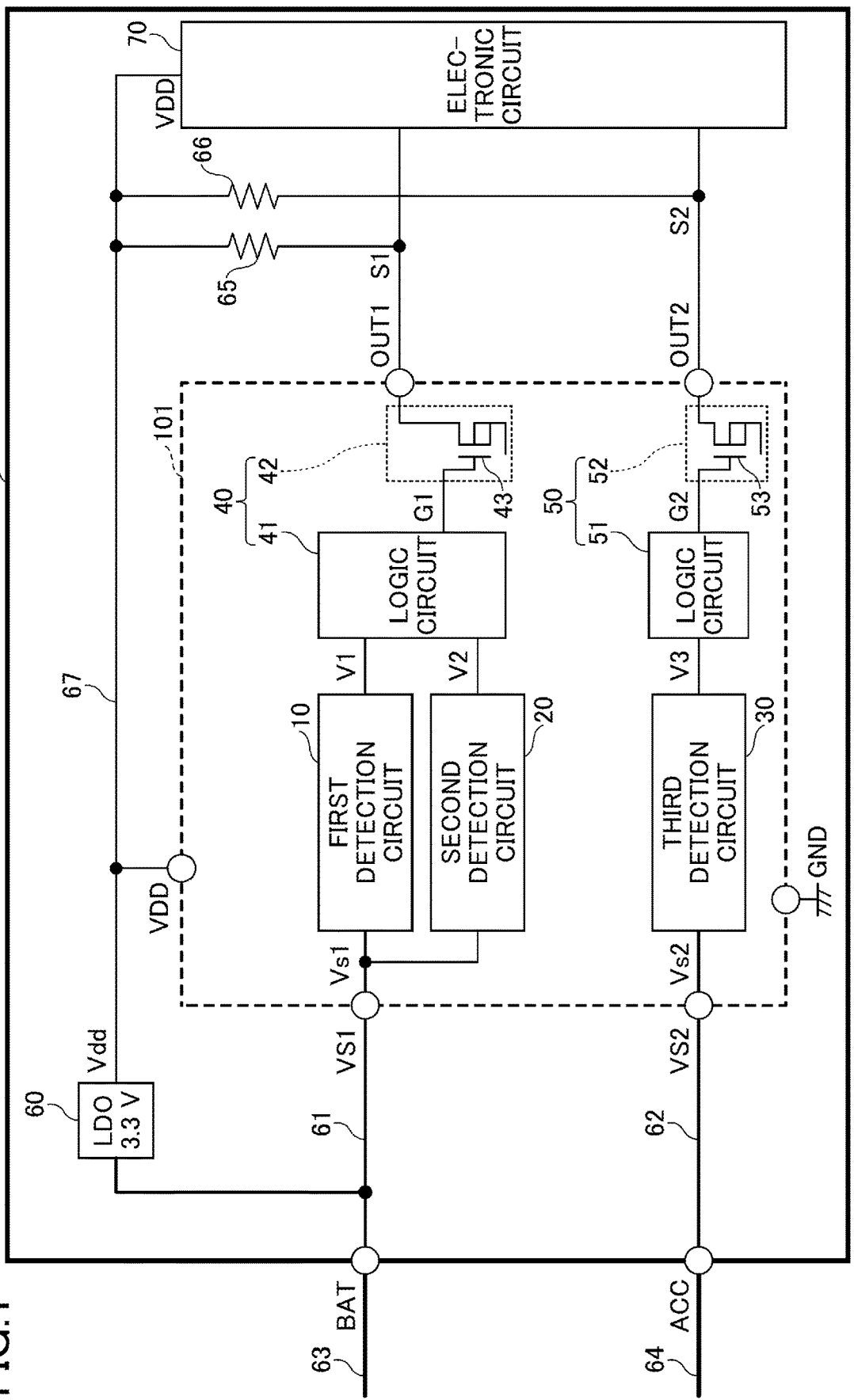
FIG. 1 is a diagram illustrating a configuration example of an electronic apparatus including a semiconductor integrated circuit according to a first embodiment.

FIG. 1 is a diagram illustrating a configuration example of an electronic apparatus including a semiconductor integrated circuit according to a first embodiment. An electronic apparatus 201 illustrated in FIG. 1 includes a reset integrated circuit (IC) 101. The reset IC 101 is an example of the semiconductor integrated circuit according to the first embodiment. A reset IC may also be referred to as a voltage detector.

The electronic apparatus 201 is for a vehicle, for example, and is used in a state installed in the vehicle. Specific examples of the electronic apparatus 201 include a car navigation apparatus, a drive recorder, an on-vehicle apparatus for an electronic toll collection (ETC) system, a universal serial bus (USB) connector, a camera, a radar, a communication apparatus, and an electronic control unit (ECU). However, the electronic apparatus 201 is not limited to such apparatuses.

The electronic apparatus 201 uses an on-vehicle power supply (not illustrated) that is connected to a battery power line 63 installed in the vehicle, as an operation power supply. The electronic apparatus 201 operates with a DC power supplied from the on-vehicle power supply (not illustrated) via the battery power line 63. The on-vehicle power supply is a 12-volt battery, for example. The battery power line 63 is a wire harness for a battery power supply, for example.

The electronic apparatus 201 is activated by an accessory signal (ACC signal) supplied via an accessory (ACC) power line 64 installed in the vehicle, in a state in which a DC power higher than or equal to a minimum operating voltage of the electronic apparatus 201 is supplied from the battery power line 63. The accessory signal is a seizure signal for turning the activation of the electronic apparatus 201 on or off. The accessory signal is a binary voltage signal. A high level of the accessory signal indicates that the electronic apparatus 201 is to be activated, and a low level of the accessory signal indicates that the activation or operation of the electronic apparatus 201 is to be stopped. The accessory power line 64 is a wire harness for accessory power supply, for example.

The electronic apparatus 201 includes a terminal BAT, a first power line (or first power supply line) 61, a terminal ACC, a second power line (or second power supply line) 62, a regulator 60, a third power line (or third power supply line) 67, an electronic circuit 70, and a reset IC 101.

The terminal BAT is a battery terminal connected to a battery power line (or battery power supply line) 63 of the vehicle. The battery power line 63 is connected to the first power line 61 of the electronic apparatus 201 via the terminal BAT. The DC power supplied from the battery power line 63 is input to the first power line 61 of the electronic apparatus 201 via the terminal BAT. The DC power input from the terminal BAT is supplied to an input terminal of the regulator 60 and a first input terminal VS1 of the reset IC 101 via the first power line 61. The first power line 61 is a power supply pattern formed on a built-in substrate of the electronic apparatus 201, mounted with the reset IC 101, for example.

The regulator 60 is a power supply circuit configured to step down the DC voltage of the first power line 61 to a constant power supply voltage Vdd. The regulator 60 steps down a DC voltage of 12 volts to generate the power supply voltage Vdd of 3.3 volts (V), for example. The power supply voltage Vdd generated by the regulator 60 is supplied to a power terminal VDD of the reset IC 101 and to a power terminal VDD of the electronic circuit 70, via the third power line 67. The third power line 67 is a power supply pattern formed on the built-in substrate of the electronic apparatus 201, mounted with the reset IC 101, for example.

The terminal ACC is an accessory power terminal connected to the accessory power line 64 of the vehicle. The accessory power line 64 is connected to the second power line 62 of the electronic apparatus 201 via the terminal ACC. The seizure signal supplied from the accessory power line 64 is input to the second power line 62 of the electronic apparatus 201 via the terminal ACC. The seizure signal input from the terminal ACC is input to a second input terminal VS2 of the reset IC 101 via the second power line 62. The second power line 62 is a power supply pattern formed on the built-in substrate of the electronic apparatus 201, mounted with the reset IC 101, for example.

The electronic circuit 70 operates at the power supply voltage Vdd, and is activated by a first reset signal S1 and a second reset signal S2 supplied from the reset IC 101. The electronic apparatus 201 is activated by the activation of the electronic circuit 70. The electronic circuit 70 controls the operation of the electronic apparatus 201. Specific examples of the electronic circuit 70 include a processor, such as a central processing unit (CPU) or the like, a microcomputer, a system-on-chip (SoC), a large scale integrated (LSI) circuit, or the like.

The electronic apparatus 201 operates at the power supply voltage Vdd generated based on the DC power supplied from the battery power line 63, and the activation of the electronic apparatus 201 is switched on and off by the seizure signal supplied from the accessory power line 64. For this reason, voltage monitoring of a voltage signal (the power supply voltage of the first power line 61) supplied from the battery power line 63 and a voltage signal (the seizure signal transmitted through the second power line 62) supplied from the accessory power line 64, may be required in the electronic apparatus 201. Further, the monitoring the power supply voltage of the first power line 61 may require detection of an overvoltage in addition to detection of a voltage drop. This is because an overvoltage may occur at the battery power line 63 and the first power line 61 due to an erroneous connection or the like of a 24-volt battery for trucks.

In order to meet such requirements, the reset IC 101 has functions of monitoring the voltages of the first power line 61 and the second power line 62. The reset IC 101 monitors the voltage of the first power line 61, and outputs the first reset signal S1 to the electronic circuit 70 from a first output terminal OUT1 based on the monitored result. The reset IC 101 monitors the voltage of the second power line 62, and outputs the second reset signal S2 to the electronic circuit 70 from a second output terminal OUT2 based on the monitored result.

The reset IC 101 includes the power terminal VDD, a ground terminal GND, the first and second input terminals VS1 and VS2, the first and second output terminals OUT1 and OUT2, a first detection circuit 10, a second detection circuit 20, a third detection circuit 30, a first output circuit 40, and a second output circuit 50.

The power terminal VDD is connected to the third power line 67, and the power supply voltage Vdd is input thereto. The ground terminal GND is connected to a reference potential, such as a ground potential or the like. The reset IC 101 operates with reference to the potential of the ground terminal GND, and operates at the power supply voltage Vdd applied between the power terminal VDD and the ground terminal GND.

The first input terminal VS1 is connected to the first power line 61, and receives the voltage of the first power line 61. The second input terminal VS2 is connected to the second power line 62, and receives the seizure signal from the second power line 62. The first output terminal OUT1 is connected to the first reset terminal of the electronic circuit 70, and outputs the first reset signal S1 generated by the reset IC 101. The second output terminal OUT2 is connected to the second reset terminal of the electronic circuit 70, and outputs the second reset signal S2 generated by the reset IC 101.

The first detection circuit 10 is a voltage detection circuit connected to the first input terminal VS1, and operates at the power supply voltage Vdd applied between the power terminal VDD and the ground terminal GND. The first detection circuit 10 detects a voltage drop (specifically, an undervoltage) at the first input terminal VS1. The first detection circuit 10 asserts a first signal V1 in response to detecting a decrease in a voltage Vs1 (specifically, an undervoltage) at the first input terminal VS1. For example, the first detection circuit 10 asserts the first signal V1 when the first detection circuit 10 detects a state in which the voltage Vs1 is lower than a predetermined first threshold value TH1. On the other hand, the first detection circuit 10 negates the first signal V1 when the first detection circuit 10 detects a state in which the voltage Vs1 exceeds the first threshold value TH1.

The second detection circuit 20 is a voltage detection circuit connected to the first input terminal VS1, and operates at the power supply voltage Vdd applied between the power terminal VDD and the ground terminal GND. The second detection circuit 20 detects a voltage rise (specifically, an overvoltage) at the first input terminal VS1. The second detection circuit 20 asserts a second signal V2 in response to detecting a rise in the voltage Vs1 (specifically, an overvoltage) at the first input terminal VS1. For example, the second detection circuit 20 asserts the second signal V2 when the second detection circuit 20 detects a state in which the voltage Vs1 exceeds a predetermined second threshold value TH2. On the other hand, the second detection circuit 20 negates the second signal V2 when the second detection circuit 20 detects a state in which the voltage Vs1 is lower than the second threshold value TH2. The second threshold value TH2 is set to be higher than the first threshold value TH1.

The third detection circuit 30 is a voltage detection circuit connected to the second input terminal VS2, and operates at the power supply voltage Vdd applied between the power terminal VDD and the ground terminal GND. The third detection circuit 30 detects a voltage drop (specifically, an undervoltage) at the second input terminal VS2. The third detection circuit 30 asserts a third signal V3 in response to detecting a decrease (specifically, an undervoltage) in a voltage Vs2 of the second input terminal VS2. For example, the third detection circuit 30 asserts the third signal V3 when the third detection circuit 30 detects a state in which the voltage Vs2 is lower than a predetermined third threshold value TH3. On the other hand, the third detection circuit 30 negates the third signal V3 when the third detection circuit 30 detects a state in which the voltage Vs2 exceeds the third threshold value TH3.

The first output circuit 40 monitors the first signal V1 and the second signal V2, and outputs the first reset signal S1 from the first output terminal OUT1 when the first signal V1 or the second signal V2 is asserted. More particularly, the first output circuit 40 outputs the first reset signal S1 from the first output terminal OUT1 when the first detection circuit 10 detects that the voltage Vs1 is lower than the first threshold value TH1, or when the second detection circuit 20 detects that the voltage Vs1 is higher than the second threshold value TH2.

The first output circuit 40 monitors the first signal V1 and the second signal V2, and stops outputting the first reset signal S1 from the first output terminal OUT1 when the first signal V1 and the second signal V2 are negated. More specifically, the first output circuit 40 cancels outputting the first reset signal S1 from the first output terminal OUT1 while the first detection circuit 10 detects that the voltage Vs1 is higher than the first threshold value TH1, and the second detection circuit 20 detects that the voltage Vs1 is lower than the second threshold value TH2.

The first output circuit 40 includes a logic circuit 41 which receives the first signal V1 and the second signal V2, and an output stage 42 configured to output the first reset signal S1 according to an output signal G1 of the logic circuit 41, for example. The logic circuit 41 operates at the power supply voltage Vdd applied between the power terminal VDD and the ground terminal GND.

The logic circuit 41 monitors the first signal V1 and the second signal V2, and outputs to the output stage 42 the output signal G1 which causes the output stage 42 to output a low-level first reset signal S1 from the first output terminal OUT1 when the first signal V1 or the second signal V2 is asserted. On the other hand, the logic circuit 41 monitors the first signal V1 and the second signal V2, and stops outputting the output signal G1 to the output stage 42 so that the output stage 42 stops outputting the first reset signal S1 from the first output terminal OUT1 when both the first signal V1 and the second signal V2 are negated. Hence, the outputting of the first reset signal S1 from the first output terminal OUT1 is canceled, and a high-level signal is output from the first output terminal OUT1.

The output stage 42 includes a transistor 43 that outputs the first reset signal S1 in an open-drain output format. The transistor 43 is a metal oxide semiconductor field effect transistor (MOSFET) having a gate which receives the output signal G1, a source connected to the ground terminal GND, and a drain connected to the first output terminal OUT1, for example. The first output terminal OUT1 is pull-up connected to the third power line 67 via an external resistor element 65. The resistor element 65 is externally connected to the reset IC 101. Because a pull-up voltage of the resistor element 65 can be set to an arbitrary voltage from the power terminal VDD, a high-level output voltage value of the first output terminal OUT1 can be arbitrarily set by the potential of the power terminal VDD.

The second output circuit 50 monitors the third signal V3, and outputs the second reset signal S2 from the second output terminal OUT2 when the third signal V3 is asserted. More particularly, the second output circuit 50 outputs the second reset signal S2 from the second output terminal OUT2 when the third detection circuit 30 detects that the voltage Vs2 is lower than the third threshold value TH3.

The second output circuit 50 monitors the third signal V3, and stops outputting the second reset signal S2 from the second output terminal OUT2 when the third signal V3 is negated. More particularly, the second output circuit 50 cancels outputting the second reset signal S2 from the second output terminal OUT2 when the third detection circuit 30 detects that the voltage Vs2 is higher than the third threshold value TH3.

The second output circuit 50 includes a logic circuit 51 which receives the third signal V3, and an output stage 52 configured to output the second reset signal S2 according to an output signal G2 from the logic circuit 51. The logic circuit 51 operates at the power supply voltage Vdd applied between the power terminal VDD and the ground terminal GND.

The logic circuit 51 monitors the third signal V3, and outputs to the output stage 52 the output signal G2 which causes the output stage 52 to output a low-level second reset signal S2 from the second output terminal OUT2 when the third signal V3 is asserted. On the other hand, the logic circuit 51 monitors the third signal V3, and stops outputting the output signal G2 to the output stage 52 so that the output stage 52 stops outputting the second reset signal S2 from the second output terminal OUT2 when the third signal V3 is negated. Hence, the outputting of the second reset signal S2 from the second output terminal OUT2 is canceled, and a high-level signal is output from the second output terminal OUT2.

The output stage 52 includes a transistor 53 that outputs the second reset signal S2 in an open-drain output format. The transistor 53 is a MOSFET having a gate which receives the output signal G2, a source connected to the ground terminal GND, and a drain connected to the second output terminal OUT2, for example. The second output terminal OUT2 is pull-up connected to the third power line 67 via an external resistor element 66. The resistor element 66 is externally connected to the reset IC 101. Because a pull-up voltage of the resistor element 66 can be set to an arbitrary voltage from the power terminal VDD, a high-level output voltage value of the second output terminal OUT2 can be arbitrarily set by the potential of the power terminal VDD.

Accordingly, the reset IC 101 monitors the voltage Vs1 of the first input terminal VS1, so as to monitor the voltage of the first power line 61 connected to the first input terminal VS1. When the reset IC 101 detects a state in which the voltage Vs1 is lower than the first threshold value TH1, the reset IC 101 outputs a signal having a level (for example, a low level) indicating an abnormally low voltage state from the first output terminal OUT1 as the first reset signal S1. Alternatively, when the reset IC 101 detects a state in which the voltage Vs1 exceeds the second threshold value TH2, the reset IC 101 outputs a signal having a level (for example, a low level) indicating an abnormally high voltage state from the first output terminal OUT1 as the first reset signal S1.

On the other hand, when the reset IC 101 detects a state in which the voltage Vs1 is higher than the first threshold value TH1 and lower than the second threshold value TH2, the reset IC 101 outputs a signal having a level (for example, a high level) indicating a normal voltage state from the first output terminal OUT1 (cancels outputting the first reset signal S1).

Similarly, the reset IC 101 monitors the voltage Vs2 of the second input terminal VS2, so as to monitor the voltage of the second power line 62 connected to the second input terminal VS2. When the reset IC 101 detects a state in which the voltage Vs2 is lower than the third threshold value TH3, the reset IC 101 outputs a signal having a level (for example, a low level) indicating an abnormally low voltage state from the second output terminal OUT2 as the second reset signal S2. On the other hand, when the reset IC 101 detects a state in which the voltage Vs2 exceeds the third threshold value TH3, the reset IC 101 outputs a signal having a level (for example, a high level) indicating a normal voltage state from the second output terminal OUT2 (cancels outputting the second reset signal S2).

Accordingly, the reset IC 101 according to the first embodiment has both a voltage drop detection function for a plurality of channels (in this example, the first power line 61 and the second power line 62) and a voltage rise detection function for a specific channel (in this example, the first power line 61). Because the voltage drop detection function for the plurality of channels and the voltage rise detection function for the specific channel can be implemented within the reset IC 101 of one chip, a component mounting area (that is, a chip area or footprint) can be reduced when compared to a case where these functions are implemented in a plurality of chips.

Figure 2:
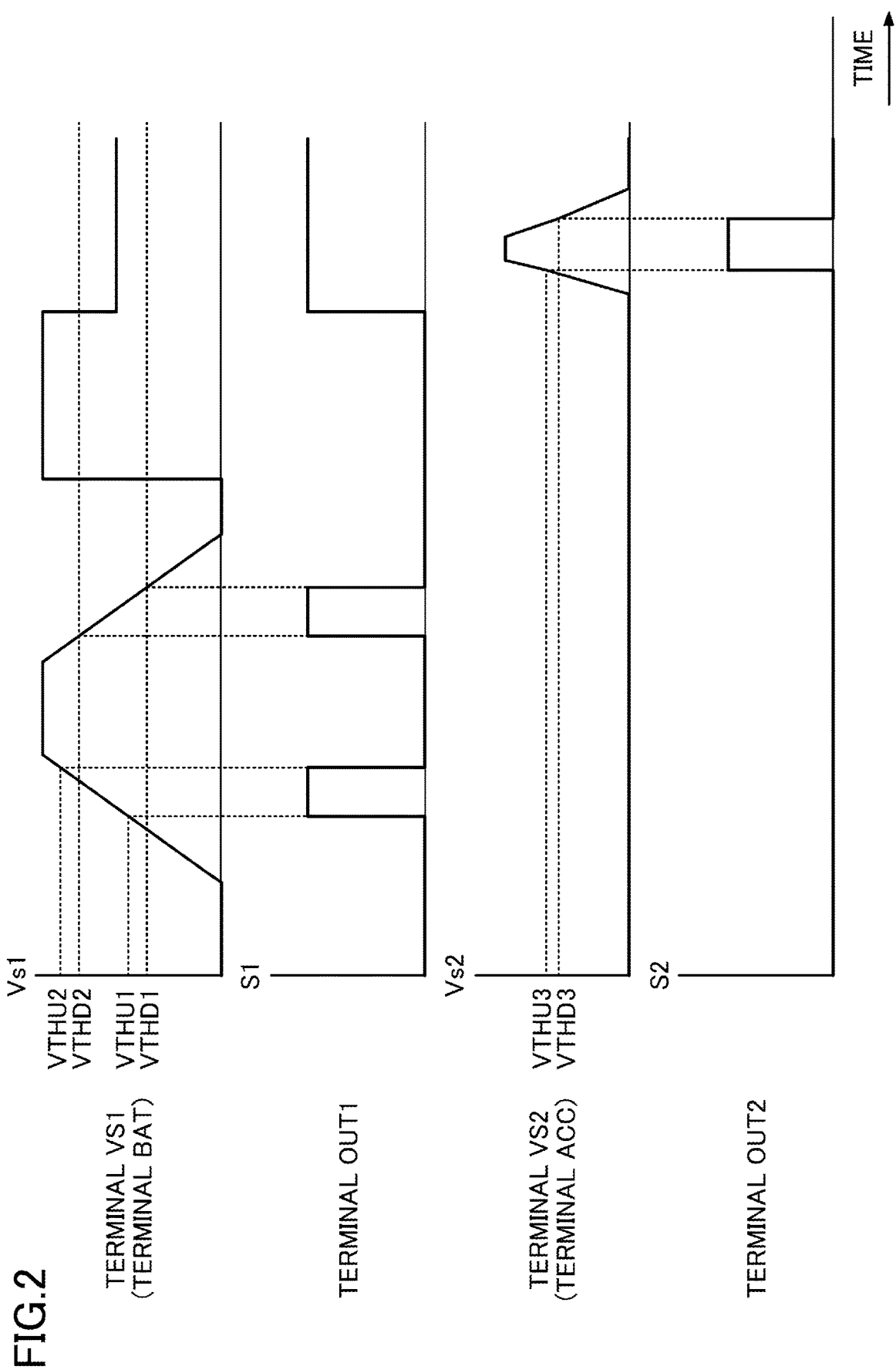
FIG. 2 is a timing chart illustrating an operation example of the semiconductor integrated circuit according to the first embodiment.

FIG. 2 is a timing chart illustrating an operation example of the semiconductor integrated circuit according to the first embodiment. When the voltage Vs1 of the first input terminal VS1 rises and becomes higher than a judgment voltage VTHU1, the first detection circuit 10 switches from asserting the first signal V1 to negating the first signal V1. When the voltage Vs1 drops and becomes lower than a judgment voltage VTHD1, the first detection circuit 10 switches from negating the first signal V1 to the asserting the signal V1. On the other hand, when the voltage Vs1 of the first input terminal VS1 rises and becomes higher than a judgment voltage VTHU2, the second detection circuit 20 switches from negating the second signal V2 to asserting the second signal V2. When the voltage Vs1 drops and becomes lower than a judgment voltage VTHD2, the second detection circuit 20 switches from asserting the second signal V2 to negating the second signal V2.

Accordingly, when the voltage Vs1 rises and becomes higher than the judgment voltage VTHU1, the reset IC 101 cancels outputting the first reset signal S1 from the first output terminal OUT1, and thus, the signal output from the first output terminal OUT1 switches from a low level to a high level. When the voltage Vs1 rises further and becomes higher than the judgment voltage VTHU2, the reset IC 101 outputs the first reset signal S1 from the first output terminal OUT1, and thus, the signal output from the first output terminal OUT1 switches from the high level to the low level. When the voltage Vs1 drops and becomes lower than the judgment voltage VTHD2, the reset IC 101 cancels outputting the first reset signal S1 from the first output terminal OUT1, and thus, the signal output from the first output terminal OUT1 switches from the low level to the high level. When the voltage Vs1 drops further and becomes lower than the judgment voltage VTHD1, the reset IC 101 outputs the first reset signal S1 from the first output terminal OUT1, and thus, the signal output from the first output terminal OUT1 switches from the high level to the low level.

The judgment voltage VTHD1 corresponds to the first threshold value TH1 described above, and is an example of a first level. The judgment voltage VTHU2 corresponds to the second threshold value TH2 described above, and is an example of a second level that is higher than the first level. The judgment voltage VTHU1 is an example of a third level that is higher than the first level and lower than the second level. The judgment voltage VTHD2 is an example of a fourth level that is higher than the third level and lower than the second level.

On the other hand, when the voltage Vs2 of the second input terminal VS2 rises and becomes higher than the judgment voltage VTHU3, the second detection circuit 20 switches from asserting the second signal V2 to negating the second signal V2. When the voltage Vs2 drops and becomes lower than the judgment voltage VTHD3, the second detection circuit 20 switches from negating the second signal V2 asserting the second signal V2.

Accordingly, when the voltage Vs2 rises and becomes higher than the judgment voltage VTHU3, the reset IC 101 cancels outputting of the second reset signal S2 from the second output terminal OUT2, and thus, the signal output from the second output terminal OUT2 switches from a low level to a high level. When the voltage Vs2 drops and becomes lower than the judgment voltage VTHD3, the reset IC 101 outputs the second reset signal S2 from the second output terminal OUT2, and thus, the signal output from the second output terminal OUT2 switches from the high level to the low level. The judgment voltage VTHU3 is set to be higher than the judgment voltage VTHD3.

Figure 3:
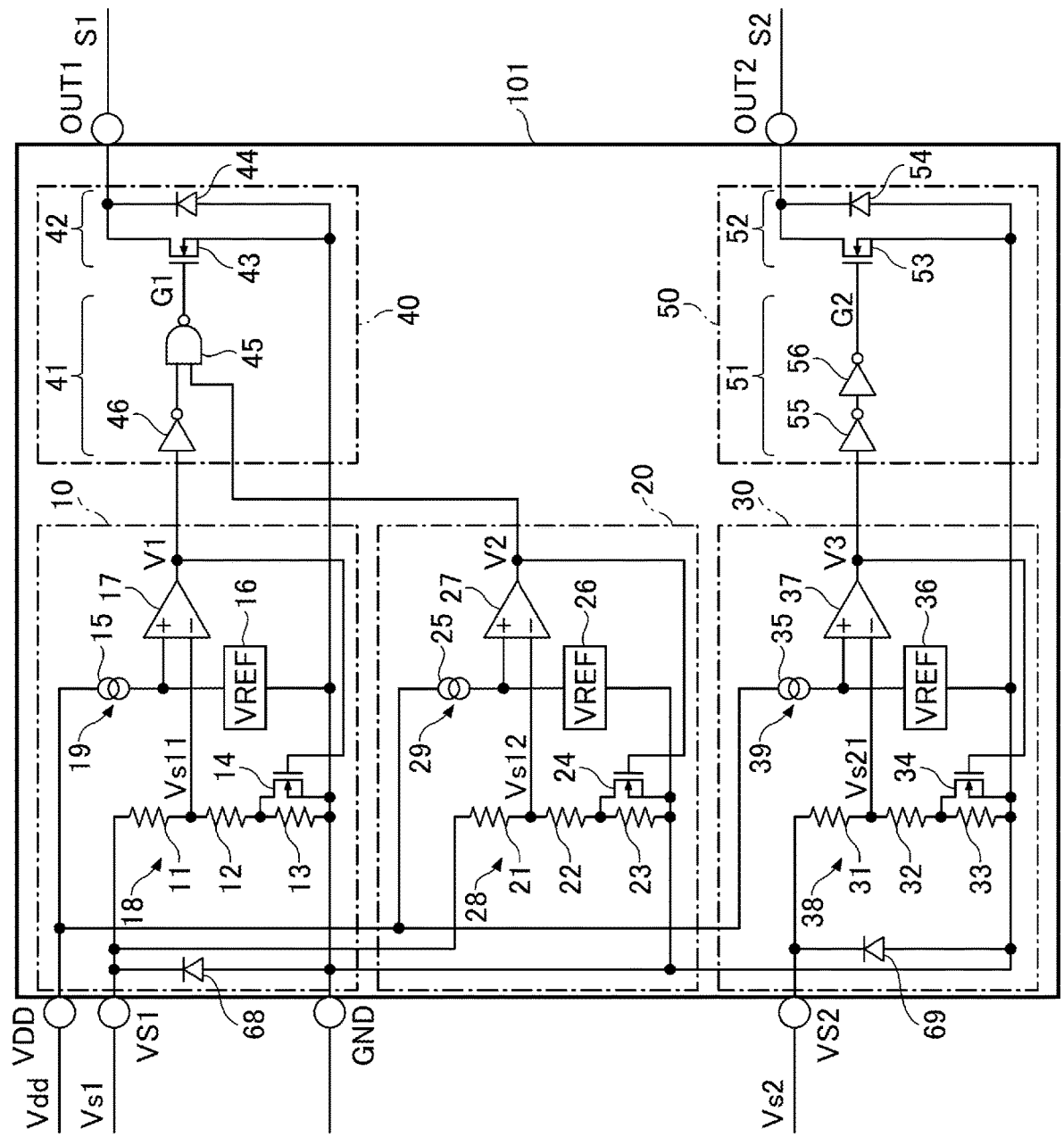
FIG. 3 is a diagram illustrating an example of an internal circuit of the semiconductor integrated circuit according to the first embodiment.

FIG. 3 is a diagram illustrating an example of an internal circuit of the semiconductor integrated circuit according to the first embodiment. FIG. 3 illustrates an example of the internal circuit of the reset IC 101. The reset IC 101 includes the first detection circuit 10, the second detection circuit 20, the third detection circuit 30, the first output circuit 40, and the second output circuit 50.

The first detection circuit 10 and the second detection circuit 20 monitor the voltage Vs1 of the first input terminal VS1. The reset IC 101 includes a diode 68 having an anode thereof connected to the ground terminal GND and a cathode thereof connected to the first input terminal VS1. The diode 68 clamps the negative voltage Vs1 by a forward voltage of the diode 68, and thus, the reset IC 101 is protected from the input of the negative voltage Vs1. Because the diode 68 is shared by the first detection circuit 10 and the second detection circuit 20, it is possible to reduce the size and cost of the reset IC 101.

The third detection circuit 30 monitors the voltage Vs2 of the second input terminal VS2. The reset IC 101 includes a diode 69 having an anode thereof connected to the ground terminal GND and a cathode thereof connected to the second input terminal VS2. The diode 69 clamps the negative voltage Vs2 by a forward voltage of the diode 69, and thus, the reset IC 101 is protected from the input of the negative voltage Vs2.

The first detection circuit 10 monitors the voltage Vs1 of the first input terminal VS1. The first detection circuit 10 asserts the first signal V1 when the voltage drop state of the voltage Vs1 is detected, and in this case, outputs a high-level first signal V1. On the other hand, the first detection circuit 10 negates the first signal V1 when the voltage drop state of the voltage Vs1 is not detected, and in this case, outputs a low-level first signal V1.

The first detection circuit 10 includes a resistive voltage divider 18 (resistors 11, 12, and 13), a comparator 17, a transistor 14, and a reference voltage generation circuit 19 (a constant current source 15 and a reference voltage source 16).

The resistive voltage divider 18 is a monitoring circuit configured to monitor the voltage Vs1 of the first input terminal VS1. The resistive voltage divider 18 is a series circuit, including the resistor 11, the resistor 12, and the resistor 13, and connected between the ground terminal GND and the first input terminal VS1. The resistive voltage divider 18 outputs a detection voltage Vs11, obtained by dividing the voltage Vs1, from a node between the resistor 11 and the resistor 12. That is, the detection voltage Vs11 has a value corresponding to the voltage Vs1.

When an output voltage (first signal V1) of the comparator 17 has a low level, the transistor 14 is turned off, and thus, the resistive voltage divider 18 outputs the detection voltage Vs11 obtained by dividing the voltage Vs1 by the resistor 11 and the resistors 12 and 13. When the output voltage (first signal V1) of the comparator 17 has a high level, the transistor 14 is turned on, and thus, the resistive voltage divider 18 outputs the detection voltage Vs11 obtained by dividing the voltage Vs1 by the resistor 11 and the resistor 12. Accordingly, a magnitude comparison between the detection voltage Vs11 generated by the resistive voltage divider 18 and a reference voltage VREF generated by the reference voltage generation circuit 19 can exhibit a hysteresis (="judgment voltage VTHU1"–"judgment voltage VTHD1").

The comparator 17 compares magnitudes of the detection voltage Vs11 and the reference voltage VREF, and outputs the first signal V1 according to the comparison result. The reference voltage VREF has a constant voltage value generated by the reference voltage generation circuit 19 by performing step-down conversion on the power supply voltage Vdd. The reference voltage VREF is input to a non-inverting input terminal of the comparator 17, and the detection voltage Vs11 is input to an inverting input terminal of the comparator 17. The comparator 17 outputs a high-level first signal V1 when the detection voltage Vs11 is lower than the reference voltage VREF, and outputs a low-level first signal V1 when the detection voltage Vs11 is higher than the reference voltage VREF.

The reference voltage generation circuit 19 generates a constant reference voltage VREF that is lower than the power supply voltage Vdd, by causing a constant current flowing from the constant current source 15 to flow to the reference voltage source 16, for example. The constant current source 15 is configured by a depletion type MOSFET having a drain thereof connected to the power supply voltage Vdd and a gate and a source thereof that are short-circuited, for example. The reference voltage source 16 is configured by a diode-connected depletion type MOSFET, for example.

The second detection circuit 20 monitors the voltage Vs1 of the first input terminal VS1. The second detection circuit 20 asserts the second signal V2 when the voltage rise state of the voltage Vs1 is detected, and in this case, outputs a low-level second signal V2. On the other hand, the second detection circuit 20 negates the second signal V2 when the voltage rise state of the voltage Vs1 is not detected, and in this case, outputs a high-level second signal V2.

The second detection circuit 20 includes a resistive voltage divider 28 (resistors 21, 22, and 23), a comparator 27, a transistor 24, and a reference voltage generation circuit 29 (a constant current source 25 and a reference voltage source 26). The second detection circuit 20 has the same configuration as the first detection circuit 10.

The resistive voltage divider 28 is a monitoring circuit configured to monitor the voltage Vs1 of the first input terminal VS1. The resistive voltage divider 18 is a series circuit, including the resistor 21, the resistor 22, and the resistor 23, and connected between the ground terminal GND and the first input terminal VS1. The resistive voltage divider 28 outputs a detection voltage Vs12, obtained by dividing the voltage Vs1, from a node between the resistor 21 and the resistor 22. That is, the detection voltage Vs12 has a value corresponding to the voltage Vs1.

When an output voltage (second signal V2) of the comparator 27 has a low level, the transistor 24 is turned off, and thus, the resistive voltage divider 28 outputs the detection voltage Vs12 obtained by dividing the voltage Vs1 by the resistor 21 and the resistors 22 and 23. When the output voltage (second signal V2) of the comparator 27 has a high level, the transistor 24 is turned on, and thus, the resistive voltage divider 28 outputs the detection voltage Vs12 obtained by dividing the voltage Vs1 by the resistor 21 and the resistor 22. Accordingly, a magnitude comparison between the detection voltage Vs12 generated by the resistive voltage divider 28 and the reference voltage VREF generated by the reference voltage generation circuit 29 can exhibit a hysteresis (="judgment voltage VTHU2"–"judgment voltage VTHD2").

The comparator 27 compares magnitudes of the detection voltage Vs12 and the reference voltage VREF, and outputs the second signal V2 according to the comparison result. The reference voltage VREF has a constant voltage value generated by the reference voltage generation circuit 29 by performing step-down conversion on the power supply voltage Vdd. The reference voltage VREF is input to a non-inverting input terminal of the comparator 27, and the detection voltage Vs12 is input to an inverting input terminal of the comparator 27. The comparator 27 outputs a high-level second signal V2 when the detection voltage Vs12 is lower than the reference voltage VREF, and outputs a low-level second signal V2 when the detection voltage Vs12 is higher than the reference voltage VREF.

The reference voltage generation circuit 29 generates a constant reference voltage VREF that is lower than the power supply voltage Vdd, by causing a constant current flowing from the constant current source 25 to flow to the reference voltage source 26, for example. The constant current source 25 is configured by a depletion type MOSFET having a drain thereof connected to the power supply voltage Vdd and a gate and a source thereof that are short-circuited, for example. The reference voltage source 26 is configured by a diode-connected depletion type MOSFET, for example.

The third detection circuit 30 monitors the voltage Vs2 of the second input terminal VS2. The third detection circuit 30 asserts the third signal V3 when the voltage drop state of the voltage Vs2 is detected, and in this case, outputs a high-level third signal V3. On the other hand, the third detection circuit 30 negates the third signal V3 when the voltage drop state of the voltage Vs2 is not detected, and in this case, outputs a low-level third signal V3.

The third detection circuit 30 includes a resistive voltage divider 38 (resistors 31, 32, and 33), a comparator 37, a transistor 34, and a reference voltage generation circuit 39 (a constant current source 35 and a reference voltage source 36). The third detection circuit 30 has the same configuration and function as the first detection circuit 10, and thus, a description thereof will be omitted by incorporating the above description of the first detection circuit 10.

The first output circuit 40 monitors logic levels of the first signal V1 and the second signal V2. The first output circuit 40 includes a logic circuit 41 and an output stage 42. The logic circuit 41 includes an inverter circuit 46 that outputs a signal obtained by inverting the logic of the first signal V1, and a NAND circuit 45 that outputs the output signal G1 that is an inverted logical product (NAND) of an output signal of the inverter circuit 46 (a logically inverted signal of the first signal V1) and the second signal V2. The output stage 42 includes a transistor 43 which receives the output signal G1, and a diode 44 connected in parallel to the transistor 43.

Accordingly, when the first signal V1 has a high level and the second signal V2 has a high level, the first output circuit 40 determines that the voltage drop state of the voltage Vs1 is detected, and sets the output signal G1 to a high level. As a result, the transistor 43 is turned on, and a low-level signal is output from the first output terminal OUT1 (the first reset signal S1 is output). When the first signal V1 has a low level and the second signal V2 has a low level, the first output circuit 40 determines that the voltage Vs1 is in the voltage rise state and sets the output signal G1 to a high level. As a result, the transistor 43 is turned on, and a low-level signal is output from the first output terminal OUT1 (the first reset signal S1 is output). When the first signal V1 has the low level and the second signal V2 has the high level, the first output circuit 40 determines that the voltage Vs1 is in a normal voltage state and sets the output signal G1 to the low level. As a result, the transistor 43 is turned off, and a high-level signal is output from the first output terminal OUT1 (the first reset signal S1 is canceled).

The second output circuit 50 monitors a logic level of the third signal V3. The second output circuit 50 includes a logic circuit 51 and an output stage 52. The logic circuit 51 includes an inverter circuit 55 that outputs a signal obtained by inverting the logic of the third signal V3, and an inverter circuit 56 that outputs the output signal G2 by inverting the logic of an output signal of the inverter circuit 55 (the logically inverted signal of the third signal V3). The output stage 52 includes a transistor 53 which receives the output signal G2, and a diode 54 connected in parallel to the transistor 53.

Accordingly, when the third signal V3 has a high level, the second output circuit 50 determines that the voltage Vs2 is in the voltage drop state, and sets the output signal G2 to a high level. As a result, the transistor 53 is turned on, and a low-level signal is output from the second output terminal OUT2 (the second reset signal S2 is output). When the third signal V3 has a low level, the second output circuit 50 determines that the voltage Vs2 is in the normal voltage state, and sets the output signal G2 to a low level. As a result, the transistor 53 is turned off, and a high-level signal is output from the second output terminal OUT2 (the second reset signal S2 is canceled).

Figure 4:
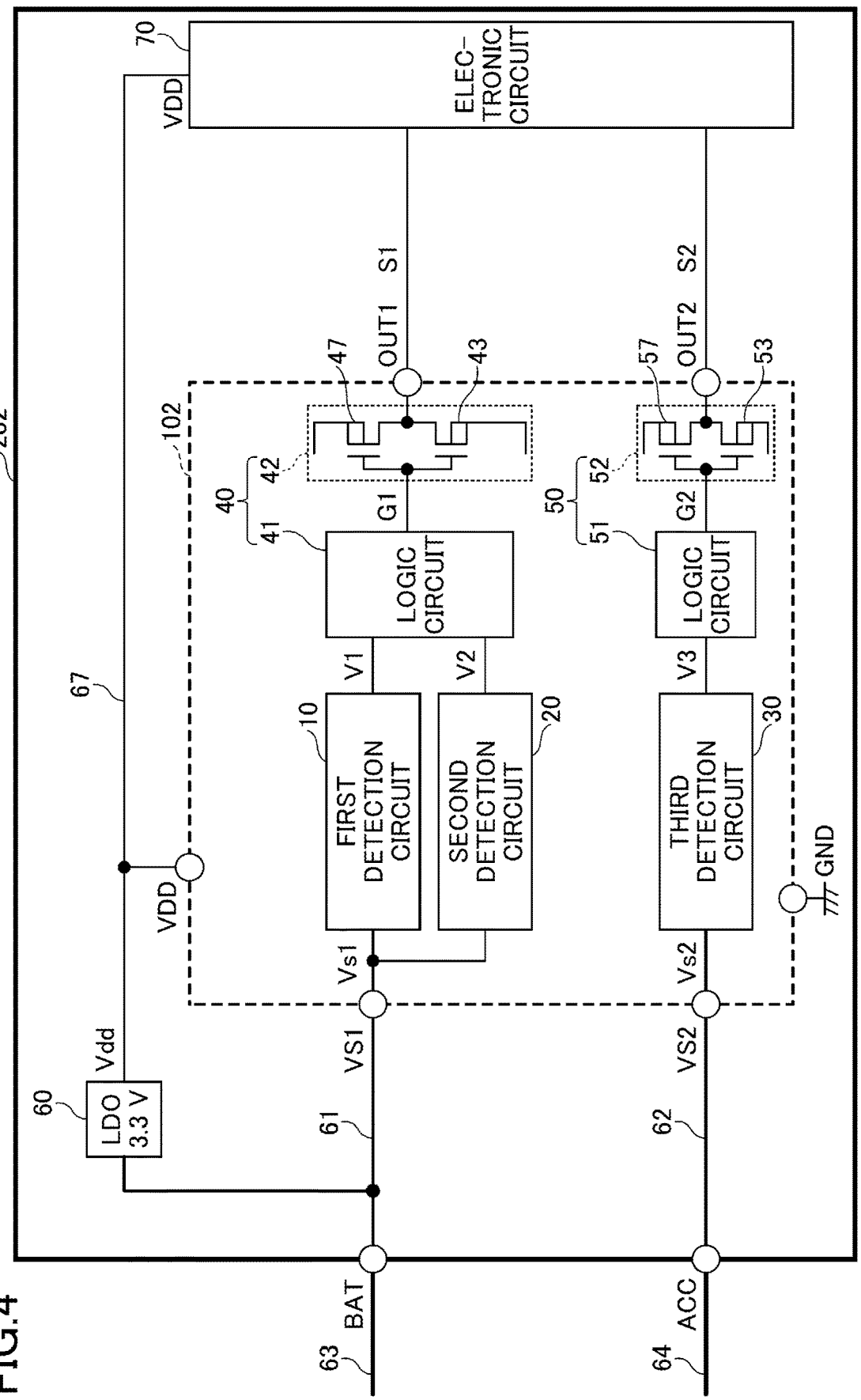
FIG. 4 is a diagram illustrating a configuration example of the electronic apparatus including the semiconductor integrated circuit according to a second embodiment.

FIG. 4 is a diagram illustrating a configuration example of the electronic apparatus including the semiconductor integrated circuit according to a second embodiment. In the second embodiment, a description of the configuration, operation, and effects that are the same as those of the first embodiment will be omitted, by incorporating the above description of the first embodiment. An electronic apparatus 202 illustrated in FIG. 4 includes a reset IC 102. The reset IC 102 is an example of the semiconductor integrated circuit according to the second embodiment. The reset IC 102 according to the second embodiment differs from the reset IC 101 according to the first embodiment in that the output stages 42 and 52 of the reset IC 102 employ a complementary metal oxide semiconductor (CMOS) output format. The output stage 42 and 52 operate at the power supply voltage Vdd applied between the power terminal VDD and the ground terminal GND.

The output stage 42 includes transistors 43 and 47 which output the first reset signal S1 with the CMOS output format. The output stage 42 includes an inverter circuit having a complementary combination of the transistors 43 and 47. Because the output stage 42 employs the CMOS output format, the resistor element 65 (refer to FIG. 1) can be eliminated, and a current consumption a current flowing to the transistor 43 via the resistor element 65 in an on state of the transistor 43 can be reduced.

The output stage 52 includes transistors 53 and 57 which output the second reset signal S2 with the CMOS output format. The output stage 52 includes an inverter circuit having a complementary combination of the transistors 53 and 57. Because the output stage 52 employs the CMOS output format, the resistor element 66 (refer to FIG. 1) can be eliminated, and a current consumption of a current flowing to the transistor 53 via the resistor element 66 in an on state of the transistor 53 can be reduced.

Figure 5:
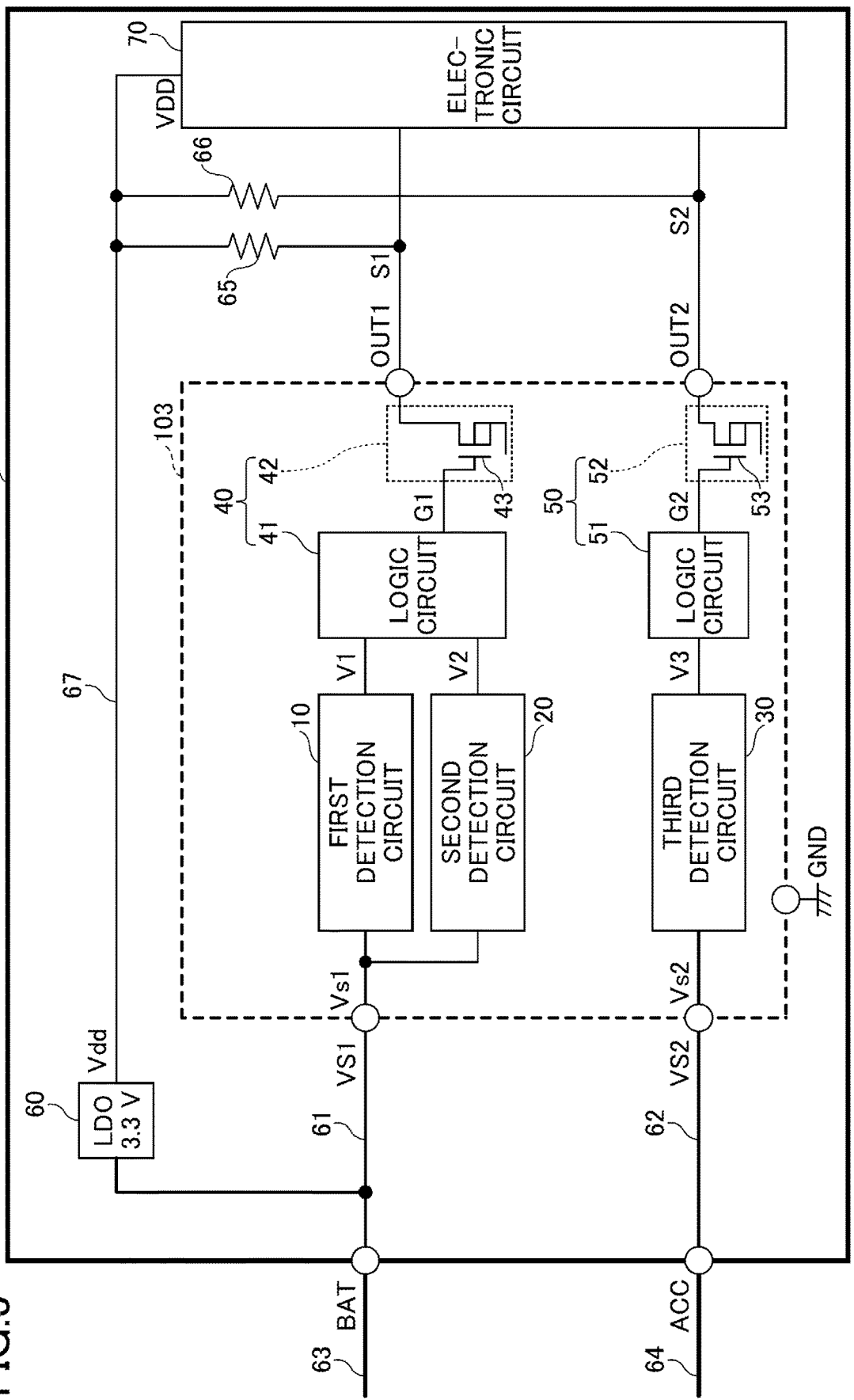
FIG. 5 is a diagram illustrating a configuration example of the electronic apparatus including the semiconductor integrated circuit according to a third embodiment.

FIG. 5 is a diagram illustrating a configuration example of the electronic apparatus including the semiconductor integrated circuit according to the third embodiment. In the third embodiment, a description of the configuration, operation, and effects that are the same as those of the first embodiment will be omitted, by incorporating the above description of the first embodiment. An electronic apparatus 203 illustrated in FIG. 4 includes a reset IC 103. The reset IC 103 is an example of the semiconductor integrated circuit according to the third embodiment. The reset IC 103 according to the third embodiment differs from the reset IC 101 according to the first embodiment in that the power terminal VDD is shared with the first input terminal VS1 (the power terminal VDD is removed).

Because the power terminal VDD is shared with the first input terminal VS1, it is possible to reduce the number of terminals required for the reset IC. Further, because the power terminal VDD is shared with the first input terminal VS1, the functions of the reset IC can be extended or enhanced using the remaining terminals.

The first detection circuit 10, the second detection circuit 20, and the third detection circuit 30 operate at a power supply voltage (in this case, the voltage Vs1) applied between the first input terminal VS1 and the ground terminal GND. For example, in FIG. 3, the comparators 17, 27, and 37, the reference voltage generation circuits 19, 29, and 39, and the logic circuits 41 and 51 operate at the voltage Vs1.

Figure 6:
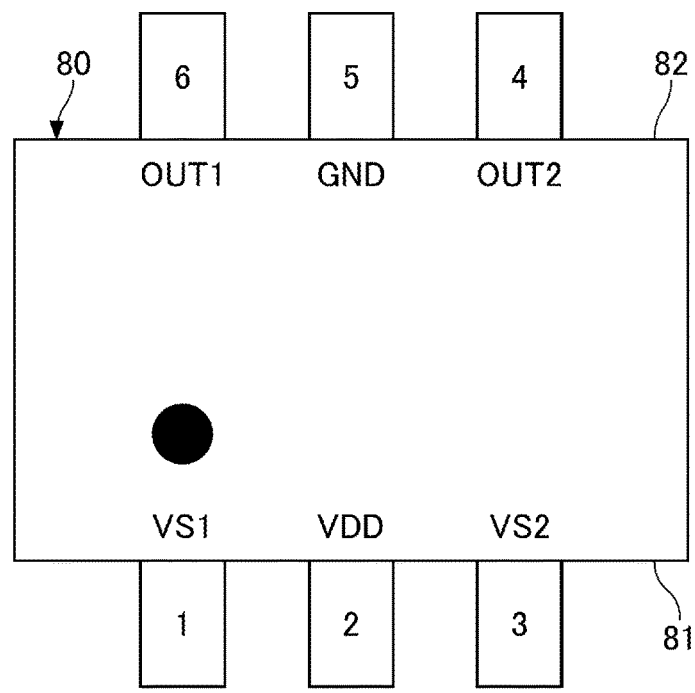
FIG. 6 is a diagram illustrating a first example of a pin arrangement of the semiconductor integrated circuit.
Figure 7:
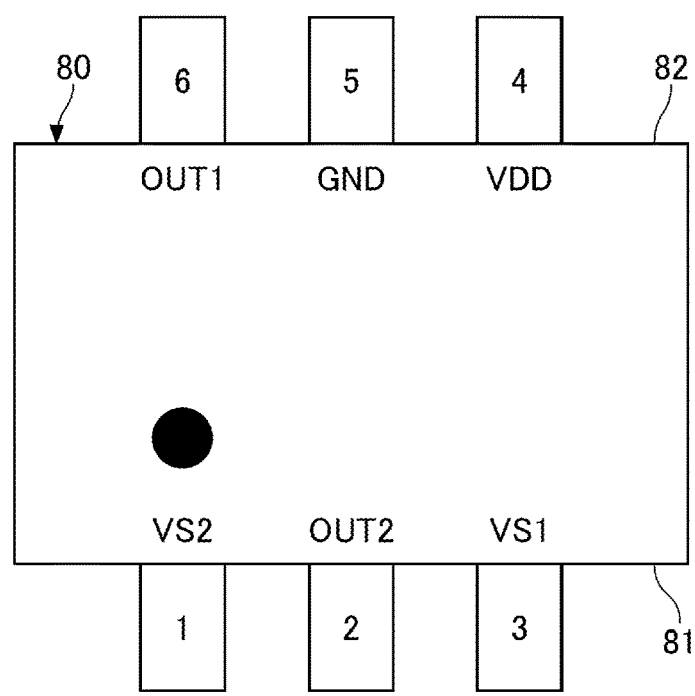
FIG. 7 is a diagram illustrating a second example of the pin arrangement of the semiconductor integrated circuit.

FIG. 6 is a diagram illustrating a first example of a pin arrangement of the semiconductor integrated circuit. FIG. 7 is a diagram illustrating a second example of the pin arrangement of the semiconductor integrated circuit. FIG. 6 and FIG. 7 are plan views schematically illustrating a reset IC covered with a package 80 of a 6-terminal small outline transistor (SOT). The package 80 has two side surfaces 81 and 82 and opposing each other. Pins 1, 2, and 3 are external connection terminals provided on the side surface 81. Pins 4, 5, and 6 are external connection terminals provided on the side surface 82.

In the case illustrated in FIG. 6, the first input terminal VS1 is arranged at the pin 1, the power terminal VDD is arranged at the pin 2, the second input terminal VS2 is arranged at the pin 3, the second output terminal OUT2 is arranged at the pin 4, the ground terminal GND is arranged at the pin 5, and the first output terminal OUT1 is arranged at the pin 6.

In the case illustrated in FIG. 7, the second input terminal VS2 is arranged at the pin 1, the second output terminal OUT2 is arranged at the pin 2, the first input terminal VS1 is arranged at the pin 3, the power terminal VDD is arranged at the pin 4, the ground terminal GND is arranged at the pin 5, and the first output terminal OUT1 is arranged at the pin 6.

In general, after an IC is mounted on a circuit board or printed circuit board (PCB), the IC may often be damaged by a short-circuit between adjacent terminals caused by a foreign substance (solder, dust, water droplet, or the like), a short-circuit caused by a whisker (phenomenon in which a metal single crystal naturally grows on a metal surface), or the like depending on the arrangement of the pins. In the pin arrangements illustrated in FIG. 6 and FIG. 7, the first and second input terminals VS1 and VS2 are not adjacent to the ground terminal GND. For this reason, a short-circuit is unlikely to occur between the first input terminal VS1 and the ground terminal GND, nor between the second input terminal VS2 and the ground terminal GND. Accordingly, the possibility of a dead short occurring between the first input terminal VS1 and the ground terminal GND, or between the second input terminal VS2 and the ground terminal GND, can be reduced to a minimum.

But in the pin arrangement illustrated in FIG. 6, the first input terminal VS1 which is arranged at the pin 1 and receives a voltage of 12 volts and the power terminal VDD which is arranged at the pin 2 and receives a voltage of 3.3 volts are adjacent to each other. If the first input terminal VS1 and the power terminal VDD were to cause a short-circuit between the adjacent pins 1 and 2, an overvoltage of 12 volts may be applied to the electronic circuit 70 which is to be driven at 3.3 volts. Similarly, the second input terminal VS2 which is arranged at the pin 3 and receives a voltage of 12 volts and the power terminal VDD which is arranged at the pin 2 and receives a voltage of 3.3 volts are adjacent to each other. If the second input terminal VS2 and the power terminal VDD were cause a short-circuit between the adjacent pins 3 and 2, an overvoltage of 12 volts may be applied to the electronic circuit 70 which is to be driven at 3.3 volts.

In the pin arrangement illustrated in FIG. 7, the power terminal VDD are provided on the side surface 82, and is thus not adjacent to the first input terminal VS1 and the second input terminal VS2 provided on the side surface 81. Thus, a short-circuit between the power terminal VDD and the first input terminal VS1 arranged at the pins 3 and 4, and a short-circuit between the power terminal VDD and the second input terminals VS2 arranged at the pins 4 and 1, are unlikely to occur. Hence, the possibility of an overvoltage being applied to the electronic circuit 70 can be reduced to a minimum.

The type of the package 80 is not limited to the SOT. The package 80 may be a package for through-hole mounting, such as a single in-line package (SIP), a dual in-line package (DIP), or the like. The package 80 may be a surface mount package, such as a small outline package (SOP), a small outline non-leaded package (SON), or the like.

The embodiments described above are presented as examples, and the present invention is not limited to the described embodiments. The embodiments described above can be implemented in various other forms, and various combinations, omissions, substitutions, modifications, or the like can be made without departing from the scope and spirit of the invention. These embodiments and modifications thereof are included in the scope and spirit of the invention, and are included in the invention described in the claims and the scope of equivalents thereof.

For example, the semiconductor integrated circuit to which the contents of the present disclosure can be applied is not limited to the reset IC, and may be other semiconductor integrated circuits, such as a power supply IC, a power management IC, or the like.

Further, the signal line for transmitting the seizure signal for activating the electronic apparatus may be an ignition power line for transmitting an ignition signal instead of the accessory power line for transmitting the accessory signal.

The electronic apparatus is not limited to an apparatus for the vehicle, and may be other electronic apparatuses for use other than the use for the vehicle. The first power line 61 and the second power line 62 are not limited to the power lines of the battery power supply system and the accessory power supply system, and may be a plurality of different power lines. For example, one of the first power line 61 and the second power line 62 may be a 5 volt power line, and the other may be a 3.3 volt power line.

In addition, the first reset signal S1 and the second reset signal S2 are not limited to the combination of the low active signal and the low active signal, and may be a combination of a low active signal and a high active signal, or a combination of a high active signal and a low active signal, or a combination of a high active signal and a high active signal. The output formats of the first output circuit 40 and the second output circuit 50 may be modified, as appropriate.

Moreover, the contents of the present disclosure are not limited to the semiconductor integrated circuit configured to monitor the voltages of two channels, and may be applied to a semiconductor integrated circuit configured to monitor voltages of three or more channels.

Further, the semiconductor integrated circuit to which the present disclosure can be applied may further include a fourth detection circuit configured to detect a voltage rise (more particularly, an overvoltage) of the second input terminal VS2. A configuration of the fourth detection circuit may be the same as that of the second detection circuit 20.

The present disclosure can provide a semiconductor integrated circuit having both a voltage drop detection function for a plurality of channels and a voltage rise detection function for a specific channel, and an electronic apparatus including the semiconductor integrated circuit.

What is claimed is:
1. A semiconductor integrated circuit comprising:
   a plurality of terminals including a first input terminal, a second input terminal, a first output terminal, and a second output terminal;

a first detection circuit configured to assert a first signal in response to detecting a voltage drop at the first input terminal;
a second detection circuit configured to assert a second signal in response to detecting an overvoltage of the first input terminal;
a third detection circuit configured to assert a third signal in response to detecting a voltage drop at the second input terminal;
a first output circuit configured to monitor the first signal and the second signal, and output a first reset signal from the first output terminal in response to asserting the first signal or the second signal; and
a second output circuit configured to monitor the third signal, and output a second reset signal from the second output terminal in response to asserting the third signal.

2. The semiconductor integrated circuit as claimed in claim 1, wherein:
the first detection circuit asserts the first signal when a voltage of the first input terminal is lower than a first level, and
the second detection circuit asserts the second signal when the voltage of the first input terminal is higher than a second level that is higher than the first level.

3. The semiconductor integrated circuit as claimed in claim 2, wherein:
the first detection circuit negates the first signal when the voltage of the first input terminal is higher than a third level,
the second detection circuit negates the second signal when the voltage of the first input terminal is lower than a fourth level, and
the third level is higher than the first level and lower than the second level, and the fourth level is higher than the third level and lower than the second level.

4. The semiconductor integrated circuit as claimed in claim 1, wherein the first output circuit cancels the output of the first reset signal from the first output terminal in response to negating the first signal and the second signal.

5. The semiconductor integrated circuit as claimed in claim 1, wherein the first output circuit includes:
a logic circuit configured to receive the first signal and the second signal; and
an output stage configured to output the first reset signal according to an output signal of the logic circuit.

6. The semiconductor integrated circuit as claimed in claim 5, wherein the output stage outputs the first reset signal in an open-drain output format.

7. The semiconductor integrated circuit as claimed in claim 5, wherein the output stage outputs the first reset signal in a CMOS output format.

8. The semiconductor integrated circuit as claimed in claim 1, wherein:
the plurality of terminals include a power terminal and a ground terminal, and
the first detection circuit, the second detection circuit, and the third detection circuit are operated by a power supply voltage applied between the power terminal and the ground terminal.

9. The semiconductor integrated circuit as claimed in claim 1, wherein:
the plurality of terminals include a ground terminal, and
the first detection circuit, the second detection circuit, and the third detection circuit are operated by a power supply voltage applied between the first input terminal and the ground terminal.

10. An electronic apparatus comprising:
the semiconductor integrated circuit according to claim 1;
a first power line coupled to the first input terminal;
a second power line coupled to the second input terminal; and
an electronic circuit coupled to the first output terminal and the second output terminal.

11. The electronic apparatus as claimed in claim 10, wherein:
the first power line is coupled to a battery power line of a vehicle, and
the second power line is coupled to an ignition power line or an accessory power line of the vehicle.

12. A semiconductor integrated circuit comprising:
a plurality of terminals including a first input terminal, a second input terminal, a first output terminal, and a second output terminal;
a first detection circuit coupled to the first input terminal;
a second detection circuit coupled to the first input terminal;
a third detection circuit coupled to the second input terminal;
a first output circuit configured to output a first reset signal from the first output terminal when the first detection circuit detects that a voltage of the first input terminal is lower than a first threshold value or when the second detection circuit detects that the voltage of the first input terminal is higher than a second threshold value that is higher than the first threshold value; and
a second output circuit configured to output a second reset signal from the second output terminal when the third detection circuit detects that a voltage of the second input terminal is lower than a third threshold value.

13. The semiconductor integrated circuit as claimed in claim 12, wherein the first output circuit cancels the output of the first reset signal from the first output terminal when the first detection circuit detects that the voltage of the first input terminal is higher than the first threshold value and the second detection circuit detects that the voltage of the first input terminal is lower than the second threshold value.

14. The semiconductor integrated circuit as claimed in claim 13, wherein:
the plurality of terminals include a power terminal and a ground terminal, and
the first detection circuit, the second detection circuit, and the third detection circuit are operated by a power supply voltage applied between the power terminal and the ground terminal.

15. The semiconductor integrated circuit as claimed in claim 14, wherein the first input terminal and the second input terminal are non-adjacent to the ground terminal.

16. The semiconductor integrated circuit as claimed in claim 15, wherein the power terminal is a terminal non-adjacent to the first input terminal and the second input terminal.

17. The semiconductor integrated circuit as claimed in claim 13, wherein:
the plurality of terminals include a ground terminal, and
the first detection circuit, the second detection circuit, and the third detection circuit are operated by a power supply voltage applied between the first input terminal and the ground terminal.

18. An electronic apparatus comprising:
the semiconductor integrated circuit according to claim 13;

a first power line coupled to the first input terminal;
a second power line coupled to the second input terminal; and
an electronic circuit coupled to the first output terminal and the second output terminal.

\* \* \* \* \*